United States Patent
Shafer et al.

(10) Patent No.: US 9,426,927 B2
(45) Date of Patent: Aug. 23, 2016

(54) SCALABLE LIQUID SUBMERSION COOLING SYSTEM

(71) Applicant: LIQUIDCOOL SOLUTIONS, INC., Rochester, MN (US)

(72) Inventors: Steve Shafer, Rochester, MN (US); Sean Archer, Rochester, MN (US); David Alan Roe, Rochester, MN (US); Lyle R. Tufty, Rochester, MN (US)

(73) Assignee: LIQUIDCOOL SOLUTIONS, INC., Rochester, MN (US)

( * ) Notice: Subject to any disclaimer, the term of this patent is extended or adjusted under 35 U.S.C. 154(b) by 88 days.

(21) Appl. No.: 14/550,068

(22) Filed: Nov. 21, 2014

(65) Prior Publication Data

US 2015/0146368 A1 May 28, 2015

Related U.S. Application Data

(60) Provisional application No. 61/907,583, filed on Nov. 22, 2013.

(51) Int. Cl.
*H05K 7/20* (2006.01)

(52) U.S. Cl.
CPC ........ *H05K 7/20236* (2013.01); *H05K 7/20272* (2013.01); *H05K 7/20772* (2013.01)

(58) Field of Classification Search
CPC .. H05K 7/20; H05K 7/20236; H05K 7/20772
USPC .......... 361/699, 679.53; 312/236; 165/104.33
See application file for complete search history.

(56) References Cited

U.S. PATENT DOCUMENTS

| | | | |
|---|---|---|---|
| 7,403,392 B2 | 7/2008 | Attlesey et al. | |
| 7,414,845 B2 | 8/2008 | Attlesey et al. | |
| 7,724,517 B2 | 5/2010 | Attlesey et al. | |
| 7,905,106 B2 | 3/2011 | Attlesey | |
| 8,089,765 B2 | 1/2012 | Attlesey | |
| 8,089,766 B2 | 1/2012 | Attlesey | |
| 2004/0221604 A1* | 11/2004 | Ota | H05K 7/20781 62/259.2 |
| 2006/0067047 A1* | 3/2006 | Pfahnl | G06F 1/20 361/679.47 |
| 2007/0227710 A1* | 10/2007 | Belady | H05K 7/2079 165/122 |
| 2008/0270572 A1 | 10/2008 | Belady et al. | |
| 2010/0103614 A1 | 4/2010 | Campbell et al. | |
| 2010/0118494 A1 | 5/2010 | Campbell et al. | |
| 2012/0300398 A1 | 11/2012 | Eckberg et al. | |
| 2013/0094146 A1 | 4/2013 | Tufty et al. | |
| 2014/0085821 A1 | 3/2014 | Regimbal et al. | |

OTHER PUBLICATIONS

STIC Search Report.*
International Search Report and Written Opinion for International Application No. PCT/US2014/066813, dated Feb. 17, 2015, 9 pgs.

* cited by examiner

*Primary Examiner* — Dion R Ferguson
*Assistant Examiner* — Mandeep S Buttar
(74) *Attorney, Agent, or Firm* — Hamre, Schumann, Mueller & Larson, P.C.

(57) ABSTRACT

A scalable liquid submersion cooling system for electronics. The system includes a plurality of modular system components, such as electronics enclosures, manifolds, pumps, and heat exchanger units. The modular system components permit the liquid submersion cooling system to be scaled up or down to accommodate changing needs. In addition, the modularity of the components facilitates portability, allowing relatively easy transport and set-up/break-down of electronic systems.

13 Claims, 20 Drawing Sheets

SCALABLE LIQUID SUBMERSION COOLING SYSTEM

FIELD

This disclosure relates to liquid submersion cooling of electronic systems, for example server computers; blade servers; disk arrays/storage systems; solid state memory devices; storage area networks; network attached storage; storage communication systems; routers; telecommunication infrastructure/switches; wired, optical and wireless communication devices; cell processor devices; printers; power supplies; and others.

BACKGROUND

Liquid submersion of electronics to cool the electronics through direct contact with a liquid coolant is known. Examples of liquid submersion cooling of electronics are disclosed in U.S. Pat. Nos. 7,905,106 and 7,403,392 among others. Liquid submersion cooling of electronics has a number of advantages over air cooling of electronics including increased energy efficiency by eliminating the need for fans and reducing HVAC cooling; quieter operation by eliminating fan noise; use in harsh environments since the electronics are contained in a sealed, liquid-tight enclosure that protects the electronics from humidity, salt, sand, dust and other contaminants; and high reliability by reducing or preventing thermal fatigue, corrosion and contamination of the electronics.

With some types of electronic systems, such as servers, the ability to scale the electronic system up or down to change capacity and performance is sometimes desirable. Scaling up or down can be achieved by altering the number of electronic components that are disposed within the enclosure, or by utilizing a plurality of systems in separate enclosures in an array, such as a server array.

SUMMARY

A scalable liquid submersion cooling system for electronics is described. The system includes a plurality of modular system components, such as electronics enclosures, manifolds, pumps, and heat exchanger units. The modular system components permit the liquid submersion cooling system to be scaled up or down to accommodate changing needs. In addition, the modularity of the components facilitates portability, allowing relatively easy transport and set-up/breakdown of electronic systems.

The modular system components include a plurality of system groupings, each system grouping includes at least one electronics enclosure and a manifold, pump and at least one heat exchanger unit with which the at least one electronics enclosure is designed to best operate with.

Each electronics enclosure includes at least a portion thereof that is liquid-tight for holding a cooling liquid, such as a dielectric cooling liquid, and houses the electronics that are to be liquid submersion cooled. The entire enclosure could be liquid-tight, or the enclosure could have a dry portion where some electronic components are not liquid-submersion cooled together with a liquid-tight portion which houses the electronics to be liquid submersion cooled. The enclosures can each have the same physical dimensions (i.e. physical size) or different physical dimensions. There is at least one liquid inlet into the liquid-tight portion of the enclosure for allowing the input of cooling liquid into the enclosure, and at least one liquid outlet from the liquid-tight portion of the enclosure for allowing the output of cooling liquid from the enclosure. The liquid inlet(s) and the liquid outlet(s) can also be provided with valved, quick connect couplings which when fluidly disconnected from the system automatically close to retain the liquid within the enclosures and which automatically open when fluidly connected to the other system components.

The electronics in each enclosure can be any electronics forming any electronic systems. In one embodiment, the electronics are high-power density electronics. For example, the electronics can be designed so that the electronics function as server computers, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, and many others.

The electronics in each enclosure can be designed to perform relatively the same or different functions. For example, the electronics in each enclosure can be designed so that they each function as a server computer system. In addition, the electronics in each enclosure can be designed to have relatively the same or comparable electronic performances, or the electronics in each enclosure can have different electronic performances. For example, if the electronics are designed to function as server computer systems, the electronics can have the same computing or processing capacity or the computing or processing capacity of each can differ.

Each manifold includes a coolant delivery manifold portion with a plurality of separate outlets for fluid connection to the liquid inlets on the enclosures and a coolant return manifold portion with a plurality of separate inlets for fluid connection to the liquid outlets on the enclosures. The sizes of the manifolds can vary to accommodate connection to a larger or smaller number of electronics enclosures and/or to accommodate connection to electronics enclosures that may require delivery and return of more or less cooling liquid for adequate cooling of the electronics.

The pumps can each have a different pump performance depending upon the electronics enclosures, manifold, and heat exchanger units they are intended to operate with. Pump performance can be measured in any suitable manner including, but not limited to, pump capacity measured in amount of liquid pumped per unit of time, output pressure, pump head, or the like. The pumps can have any mechanical design known in the art that is suitable for pumping the cooling liquid.

The heat exchanger units can each have differing heat exchange capacities, with each heat exchanger unit being designed specifically for use with a particular combination of electronics enclosures, manifold and pump to provide sufficient cooling of the cooling liquid. For example, the heat exchanger units can have different sizes with differing heat exchange areas. Alternatively, two or more of the heat exchanger units, having the same size (or the same heat exchange capacity) or different sizes (or different heat exchange capacity) can be chained together to modify the overall heat exchange capacity to collectively cool the cooling liquid.

The heat exchanger units can be designed for any type of heat exchange, such as conduction or convection, and can have any type of flow arrangement including, but not limited to, parallel flow, counter-flow, and cross flow. In one embodiment, the heat exchanger unit(s) is buried in the ground. In another embodiment, the heat exchanger unit is disposed in a body of water such as a lake or a tank that holds water. In one embodiment, the heat exchanger unit(s) receives both the electronics cooling liquid and a liquid coolant, such as water, which exchanges heat with the electronics cooling liquid. The heat energy recovered by the liquid coolant can then be used for other uses.

The fluid connections between the modular system components can be achieved using suitable hoses having quick connect fluid couplings for connection to the various components. The hoses can also have different sizes allowing accommodation of different fluid flow amounts and even permitting adjustment of system pressures.

DRAWINGS

FIG. 1 schematically depicts a system grouping of a modular liquid submersion cooling system described herein, where the system grouping includes an electronics enclosure, a manifold, a pump and a heat exchanger unit.

DETAILED DESCRIPTION

FIGS. 1-20 illustrate various examples of modular components, system groupings, and modular liquid submersion cooling systems for use in cooling electronic systems. The cooling systems are composed of modular components that permit the cooling system to be scaled up or down to accommodate changing cooling needs. In addition, the modularity of the components facilitates portability of the cooling system, allowing relatively easy transport and set-up/breakdown of liquid submersion cooled electronic systems.

Each cooling system employs liquid submersion cooling of electronics forming any electronic systems. In one embodiment, the electronics are high-power density electronics. For example, the electronics can be designed so that the electronics function as server computers, blade servers, disk arrays/ storage systems, solid state memory devices, storage area networks, network attached storage, storage communication systems, routers, telecommunication infrastructure/switches, wired, optical and wireless communication devices, cell processor devices, printers, power supplies, and many others.

The cooling liquid used to submerge the electronics can be, but is not limited to, a dielectric liquid. The cooling liquid can be single phase or two-phase. It is preferred that the cooling liquid have a high enough thermal transfer capability to handle the amount of heat being generated by the submerged electronic components so that the cooling liquid does not change state. Enough of the liquid is present in each electronics enclosure in order to submerge the heat generating components that one wishes to submerge. So in some instances the liquid may fill substantially the entire electronics enclosure, while in other instances the liquid may only partially fill the enclosure.

Figure 1:
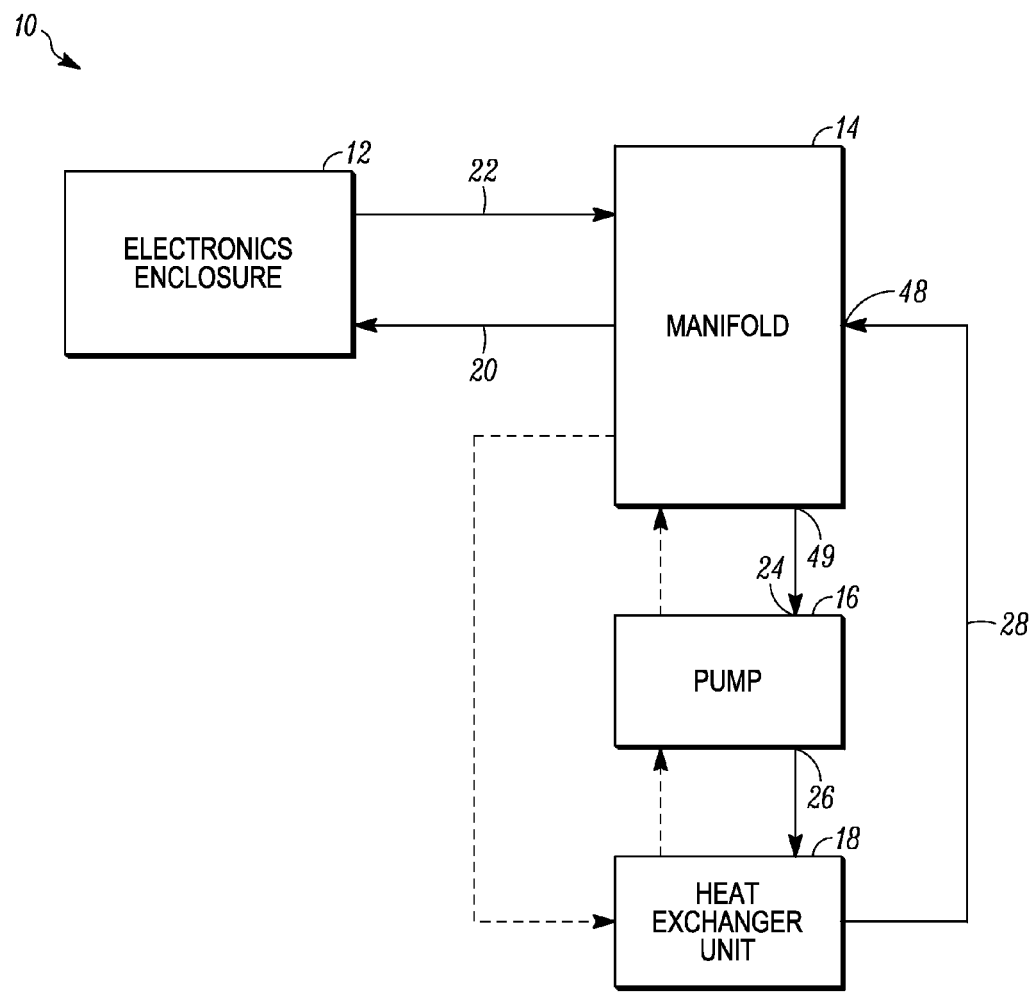

The various modular system components described below can be arranged into a plurality of system groupings, one of which is illustrated in FIG. 1. As illustrated in FIG. 1, each system grouping 10 includes at least one modular electronics enclosure 12, and a modular manifold 14, modular pump 16 and at least one modular heat exchanger unit 18 with which the at least one electronics enclosure 12 is designed to best operate with. Each of the components 12, 14, 16, 18 is designed to be modular to allow the system to be scaled up or down.

In the illustrated example, the modular enclosure 12 is fluidly connected to the modular manifold 14 via a cooling liquid supply line 20 which feeds cooling liquid into the enclosure for cooling electronics within the enclosure 12 and a cooling liquid return line 22 which directs heated cooling liquid from the enclosure or subsequent cooling of the cooling liquid.

With continued reference to FIG. 1, in one embodiment, the pump 16 has an inlet 24 fluidly connected to the manifold 14 and an outlet 26 that is fluidly connected to the heat exchanger unit 18 in order to pump heated cooling liquid from the manifold to the heat exchanger unit. The cooling liquid is cooled in the heat exchanger unit and then returned to the manifold via return line 28 where it is directed back into the enclosure via the supply line 20. Alternatively, in another embodiment illustrated in dashed lines, heated cooling liquid is directed from the manifold directly into the heat exchanger unit where it is cooled, and then pumped by the pump back into the manifold.

Figure 2:
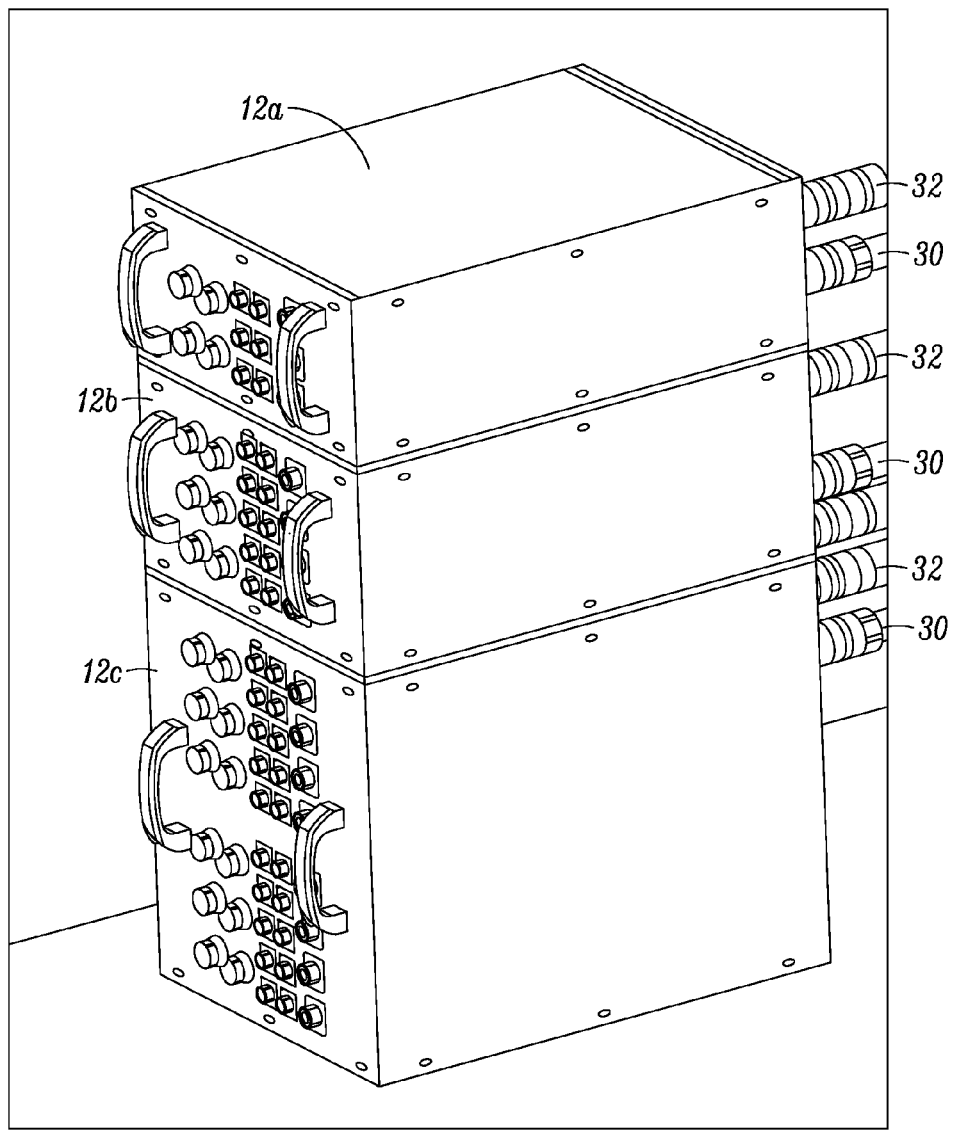
FIG. 2 illustrates a plurality of modular electronics enclosures that can be used with the modular liquid submersion cooling system.
Figure 3:
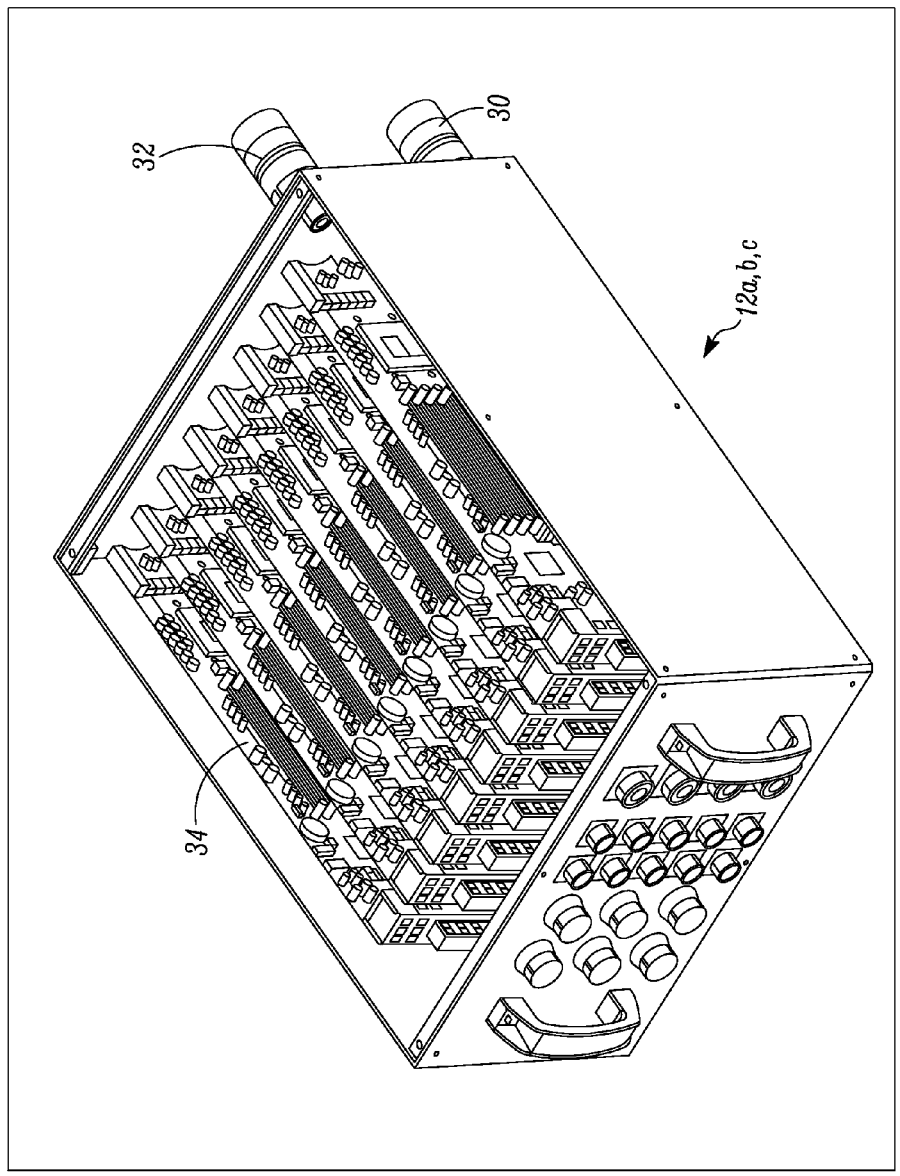
FIG. 3 is a perspective view of one of the modular electronics enclosures with one of the walls removed to show the interior of the enclosure.

The modular electronics enclosures are illustrated in FIGS. 2 and 3. FIG. 2 illustrates 3 differently sized electronics enclosures 12a, 12b, 12c. Each of the electronics enclosures 12a-c includes at least a portion thereof that is liquid-tight for holding the cooling liquid, and houses the electronics that are to be liquid submersion cooled. The entire enclosure could be liquid-tight, or the enclosure could have a dry portion where some electronic components are not liquid-submersion cooled together with a liquid-tight portion which houses the electronics to be liquid submersion cooled.

The electronics enclosures 12a, 12b, 12c are illustrated as having different physical sizes, with the enclosure 12a being the smallest in size, the enclosure 12b being bigger than the enclosure 12a, and the enclosure 12c being the largest. However, the enclosures can each have the same physical dimensions (i.e. physical size) if desired. In addition, more than one of each electronic enclosure 12a-c can be used simultaneously in a system, and the enclosures 12a-c can be used together in any number to form a system. There can also be less or more than three differently sized enclosures.

Other than the different physical sizes, the enclosures 12a-c are generally similar in overall construction. In particular, with reference to FIGS. 2 and 3, each enclosure includes at least one liquid inlet 30 into the liquid-tight portion of the enclosure for allowing the input of cooling liquid into the enclosure, and at least liquid outlet 32 from the liquid-tight portion of the enclosure for allowing the output of cooling liquid from the enclosure. The liquid inlet(s) and the liquid outlet(s) can also be provided with valved, quick connect couplings which when fluidly disconnected from the system automatically close to retain the liquid within the enclosures and which automatically open when fluidly connected to the other system components. The use of valved, quick connect couplings with a liquid-tight enclosure is described in U.S. Pat. No. 7,905,106.

Each enclosure can be formed from any suitable material including, but not limited to, plastics, metals such as extruded aluminum, or the like. In one embodiment, the enclosures 12a-c are designed to be compatible with and mountable on rack enclosures, or the enclosures 12a-c can be designed to be stackable with one another.

As best seen in FIG. 3, each enclosure 12a-c houses electronics 34 that in use are submerged in the cooling liquid. The electronics 34 can form any electronic systems. In one embodiment, the electronics 34 are high-power density electronics. For example, the electronics 34 can be designed so that the electronics function as server computers, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, and many others.

The electronics 34 in each enclosure 12a-c can be designed to perform relatively the same or different functions. For example, the electronics 34 in each enclosure 12a-c can be designed so that they each function as a server computer system. Alternatively, the electronics in one enclosure can be designed to function as a server computer system while the electronics in another enclosure can be designed to function as a data storage system.

In addition, the electronics in each enclosure can be designed to have relatively the same or comparable electronic performances, or the electronics in each enclosure can have different electronic performances. For example, if the electronics are designed to function as server computer systems, the electronics can have the same computing or processing capacity, or the computing or processing capacity of each can differ.

Because the enclosures 12a-c have different sizes, or when multiple enclosures 12a-c are used together in a system, the cooling requirements change and different amounts of cooling liquid and/or cooling liquid at different pressures may be needed in order to achieve optimal cooling. Therefore, as the enclosures 12a-c that are used change, the modular manifold 14, the modular pump 16 and the at least one modular heat exchanger unit 18 can be changed to accommodate the differing cooling requirements.

Figure 4A:
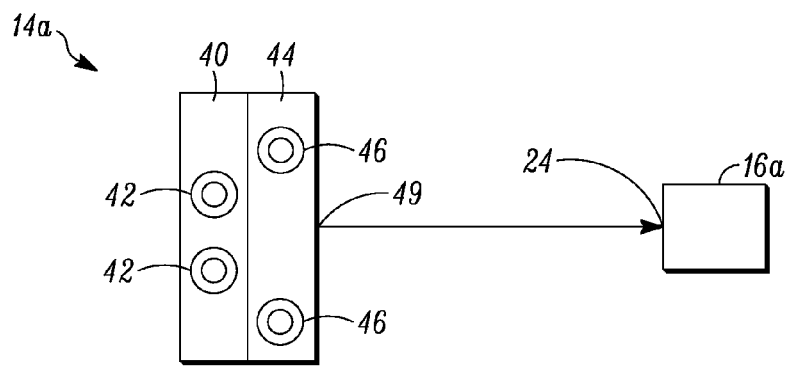
FIGS. 4A, 4B and 4C illustrate different combinations of modular manifolds and pumps that can be used with the modular liquid submersion cooling system.
Figure 4B:
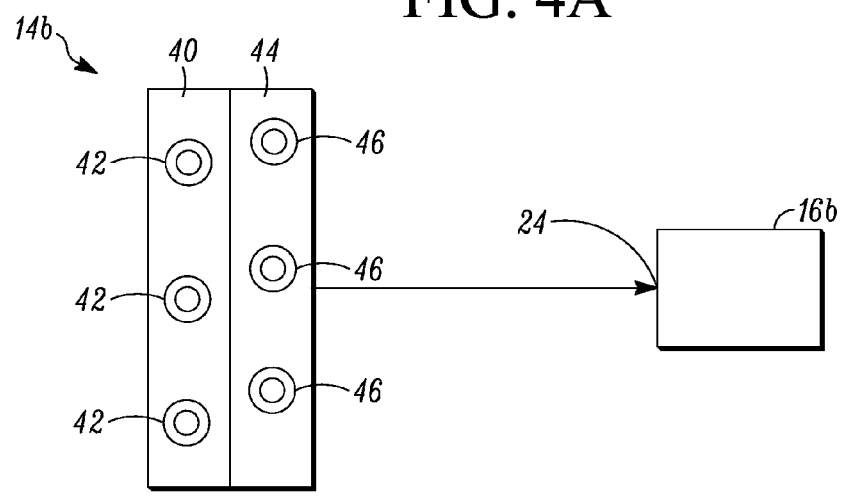
Figure 4C:
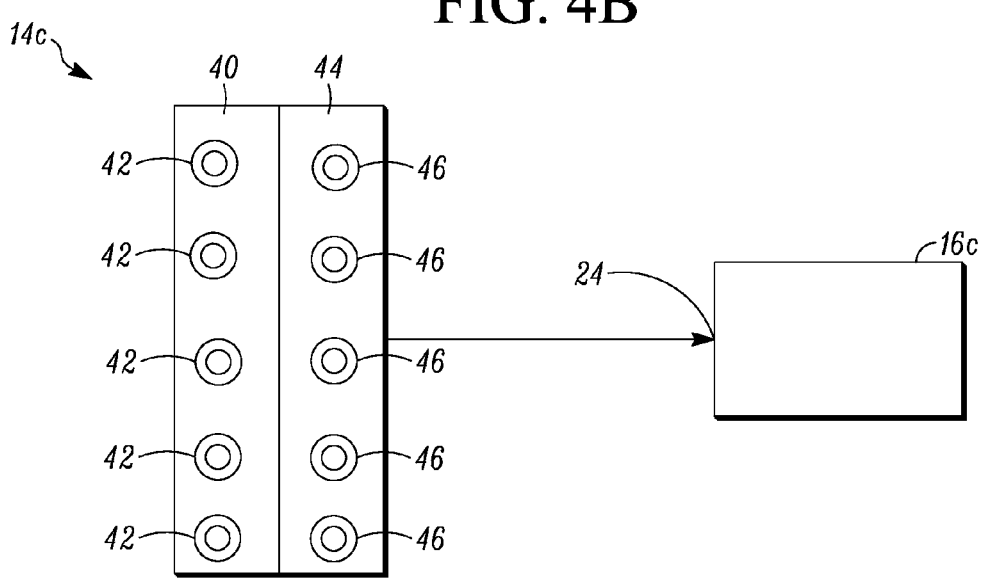

With reference to FIGS. 4A-C, a plurality of manifold 14a-c/pump 16a-c combinations are illustrated. The manifolds 14a-c are constructed in generally similar fashion except for their size. Likewise, the pumps 16a-c are generally similar except for their performance. There can be less or more than three manifold/pump combinations.

Each manifold 14a-c includes a coolant delivery manifold portion 40 with a plurality of separate liquid outlets 42 for fluid connection to the liquid inlets 30 on the enclosures 12a-c, and a coolant return manifold portion 44 with a plurality of separate liquid inlets 46 for fluid connection to the liquid outlets 32 on the enclosures 12a-c. The delivery manifold portion 40 includes at least one inlet 48 (seen in FIG. 1) through which cooled cooling liquid enters the manifold portion 40. In addition, the return manifold portion 44 includes at least one outlet 49 (FIGS. 4A-C) through which heated cooling liquid exits to be cooled by the heat exchanger unit(s) 18.

The manifold portions 40, 44 and the number of outlets 42 and inlets 46 in the manifolds 14a-c vary to accommodate connection to a larger or smaller number of electronics enclosures and/or to accommodate connection to electronics enclosures that may require delivery and return of more or less cooling liquid for adequate cooling of the electronics. For example, in the illustrated example, the manifold 14a is the smallest with the smallest manifold portions 40, 44 and two outlets 42 and inlets 46; the manifold 14b is of medium size with manifold portions 40, 44 that are larger in volume than the manifold portions of the manifold 14a and with three outlets 42 and inlets 46; and the manifold 14c is of large size with manifold portions 40, 44 that are larger in volume than the manifold portions of the manifolds 14a, 14b and with five outlets 42 and inlets 46.

Each manifold 14a-c can be formed from any suitable material including, but not limited to, plastics, metals such as extruded aluminum, or the like.

The pumps 16a-c are designed to each have a different pump performance depending upon the electronics enclosures 12a-c, manifold(s) 14a-c, and heat exchanger unit(s) 18 they are intended to operate with. Pump performance as used herein means any quantifiable measure of the performance of a pump including, but not limited to, pump capacity measured in amount of liquid pumped per unit of time, output pressure, pump head, or the like. In FIGS. 4A-C, the pump 16a is intended for use with the manifold 14a and thus has the lowest performance; the pump 16b is intended for use with the manifold 14b and thus has a performance higher than the pump 16a; and the pump 16c is intended for use with the manifold 14c and thus has the highest performance. Each pump 16a-c has its inlet 24 connected to the outlet of the manifold portions 44 of the respective manifold 14a-c.

The pumps can have any mechanical design known in the art that is suitable for pumping the cooling liquid, for example centrifugal pumps. In one embodiment, the pumps 16a-c are powered by AC/DC current and are packaged in rugged enclosures for use of the pumps in rugged environments.

In one example, the manifold 14a and the pump 16a are designed for use with cooling one or more enclosures having electronics that generate up to about 5 kilowatts (kW) of energy during use; the manifold 14b and the pump 16b are designed for use with cooling one or more enclosures having electronics that generate between about 5 kW and about 15 kW of energy during use; and the manifold 14c and the pump 16c are designed for use with cooling one or more enclosures having electronics that generate between about 15 kW and about 30 kW of energy.

Figure 5A:
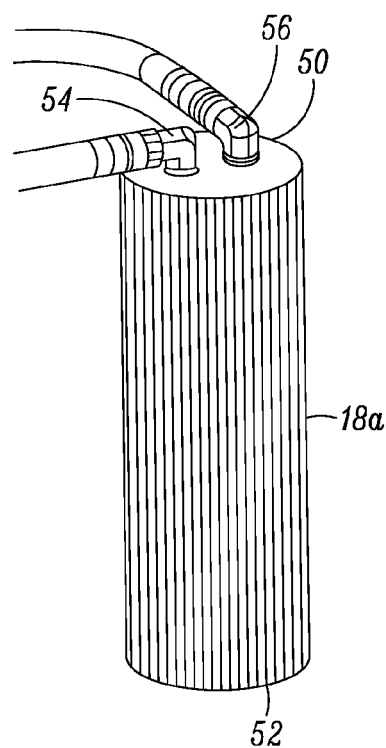
FIGS. 5A and 5B illustrate two differently sized heat exchanger units that can be used with the modular liquid submersion cooling system.
Figure 5B:
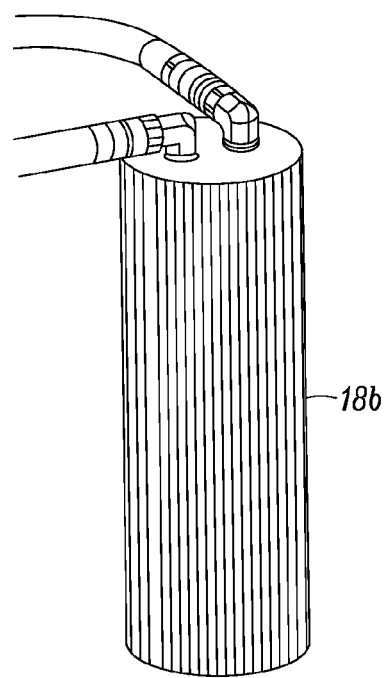

FIGS. 5A and 5B illustrate two examples of heat exchanger units 18a, 18b. The heat exchanger units 18a, 18b have differing heat exchange capacities, with each heat exchanger unit being designed specifically for use with a particular combination of electronics enclosures, manifold and pump to provide sufficient cooling of the cooling liquid. For example, in the examples illustrated in FIGS. 5A, 5B, the heat exchanger units 18a, 18b can have different sizes with differing heat exchange areas, with the heat exchanger unit 18a being designed for use with a 5 kW electronics system and the heat exchanger unit 18b being designed for use with a 10 kW electronics system. However, there can be more than two heat exchanger units having different heat exchange capacities.

Further details on the specific construction of the heat exchanger units 18a, b will be discussed below with respect to FIGS. 10-20. But in general, each heat exchanger unit 18a, b is a generally elongated construction with a first axial end 50 and a second axial end 52, with a plurality of elongated, radially extending heat exchange fins on an outer surface thereof that extend axially and continuously generally from the first axial end 50 to the second axial end 52. Heated cooling liquid to be cooled is input into each heat exchanger through one of the axial ends through an inlet 54 and cooled cooling liquid is output through one of the axial ends through an outlet 56. In the examples illustrated in FIGS. 5A, B, the inlet 54 and the outlet 56 are at the same axial end, in particular the first axial end 50. However, the inlet and the outlet need not be at the same axial end. In addition, further variations of the heat exchanger units are discussed below with respect to FIGS. 10-20.

Figure 6A:
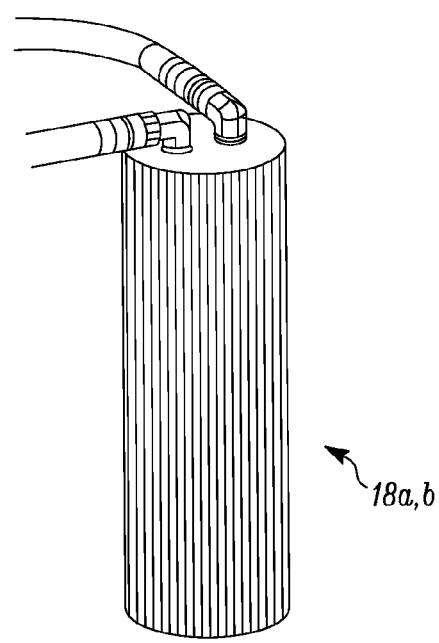
FIGS. 6A, 6B and 6C illustrate examples of chaining modular heat exchanger units to one another to increase heat exchange capacity.
Figure 6B:
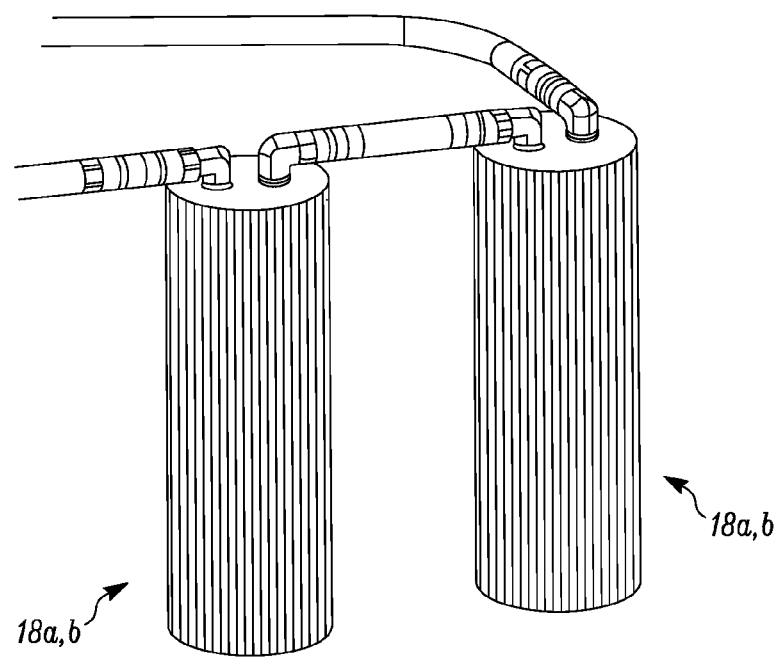
Figure 6C:
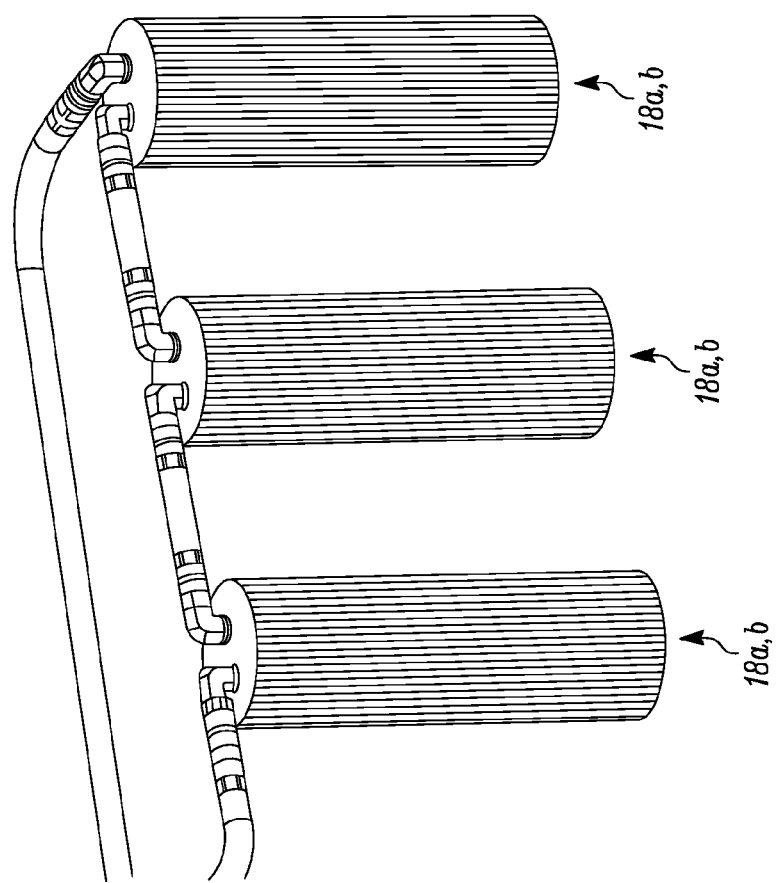

Depending upon the cooling needs, one or more than one of the heat exchanger units 18a,b can be used in any combination thereof. For example, FIG. 6A shows use of a single one of the heat exchangers 18a, 18b. FIG. 6B shows two of the heat exchanger units 18a, 18b daisy chained together so that the cooling liquid is initially cooled by the first heat exchanger and then output to the second heat exchanger unit for additional cooling before being directed back to the manifold 14. FIG. 6C illustrates three of the heat exchanger units 18a, b daisy chained together so that the cooling liquid is initially cooled by the first heat exchanger, then output to the second heat exchanger unit for additional cooling, and then output to the third heat exchanger before being directed back to the manifold 14.

The heat exchanger units can be designed for any type of heat exchange, such as conduction or convection, and can have any type of flow arrangement including, but not limited to, parallel flow, counter-flow, and cross flow. In some embodiments, the cooling liquid can exchange heat with a secondary cooling fluid, such as water, described further below.

The fluid connections between the modular system components 12, 14, 16, 18 can be achieved using suitable hoses having quick connect fluid couplings for connection to the various components. The hoses can also have different sizes allowing accommodation of different fluid flow amounts and even permitting adjustment of system pressures.

Figure 7:
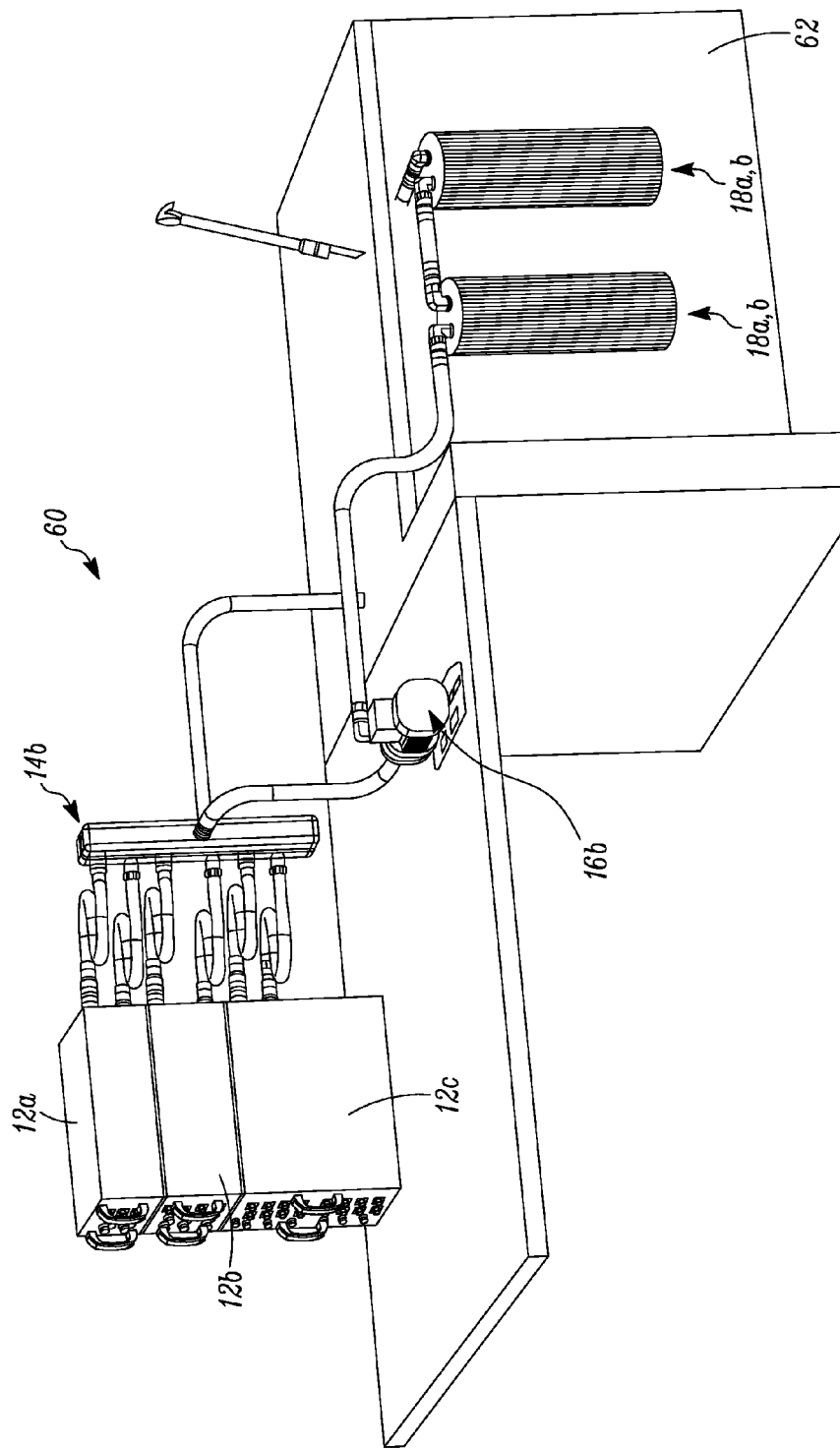
FIG. 7 illustrates an exemplary application of an embodiment of the modular liquid submersion cooling system described herein.

FIG. 7 illustrates an exemplary application of an embodiment of the modular liquid submersion cooling system described herein. The system 60 illustrated in FIG. 7 uses two of the heat exchanger units 18a, b that are buried in the ground 62 to cool the cooling liquid as it flows through the heat exchanger units. In this example, the system 60 includes the three differently sized enclosures 12a, 12b, 12c that are fluidly connected to the manifold 14b and the pump 16b. Cooled cooling liquid is input into the enclosures 12a-c from the manifold portion 40 of the manifold 14b. The cooling liquid submerges the electronics, cooling the electronics and picking up heat therefrom. Heated cooling liquid is pumped into the manifold portion 44 of the manifold, and then into the pump 16b which pumps the liquid to the heat exchanger units 18a, b which cools the liquid before the liquid is returned to the manifold 14b.

Figure 8:
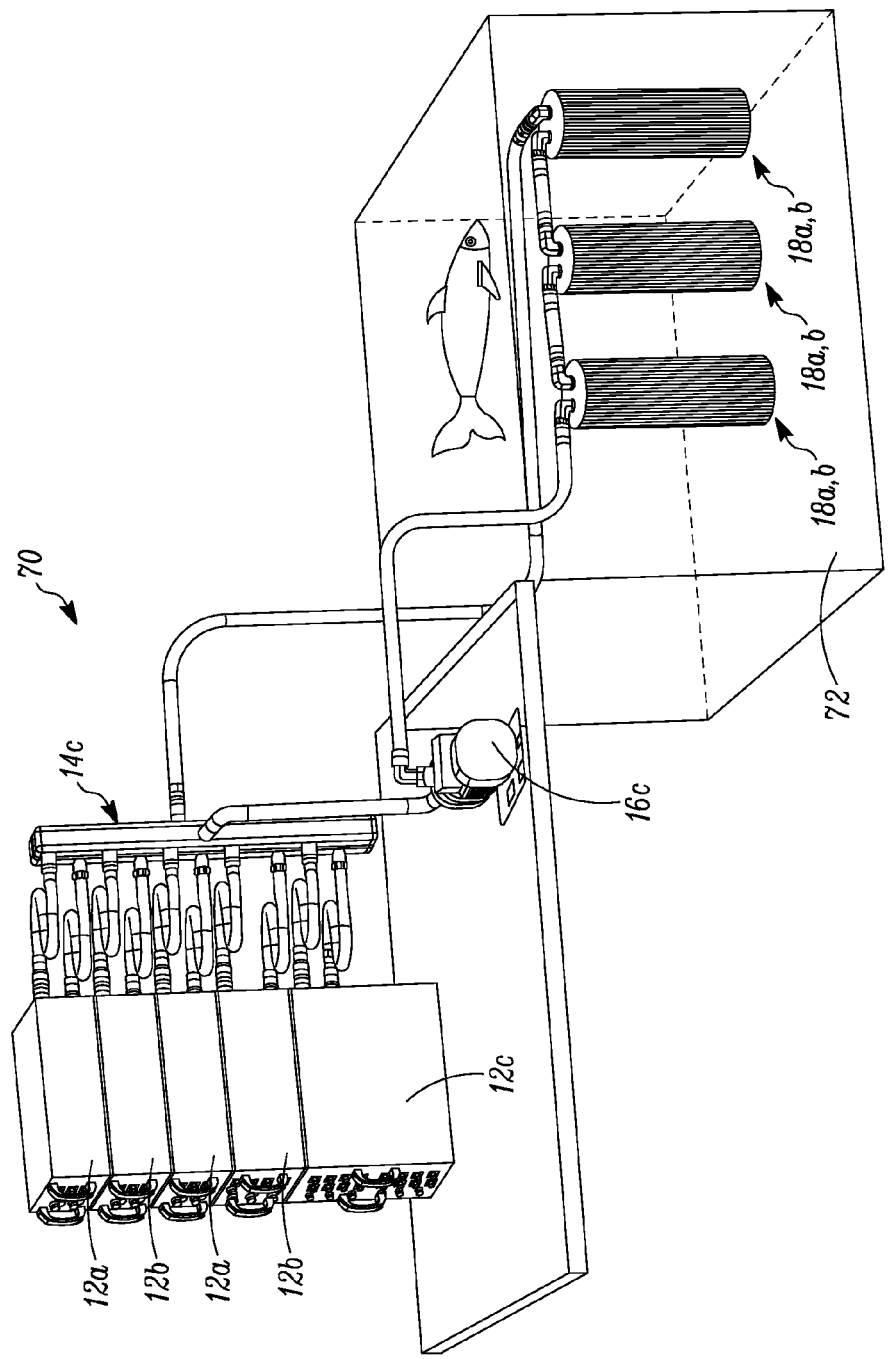
FIG. 8 illustrates another exemplary application of an embodiment of the modular liquid submersion cooling system described herein.

FIG. 8 illustrates another exemplary application of an embodiment of the modular liquid submersion cooling system described herein. The system 70 illustrated in FIG. 8 uses three of the heat exchanger units 18a, b that are submerged in a body of water 72, such a lake, sea, ocean, pond, tank of water, or the like, to cool the cooling liquid as it flows through the heat exchanger units. In this example, the system 70 includes two of the enclosures 12a, two of the enclosures 12b and one of the enclosures 12c that are fluidly connected to the manifold 14c and the pump 16c. Cooled cooling liquid is input into the enclosures from the manifold portion 40 of the manifold 14c. The cooling liquid submerges the electronics, cooling the electronics and picking up heat therefrom. Heated cooling liquid is pumped into the manifold portion 44 of the manifold, and then into the pump 16c which pumps the liquid to the heat exchanger units 18a, b which cools the liquid before the liquid is returned to the manifold 14c.

Figure 9:
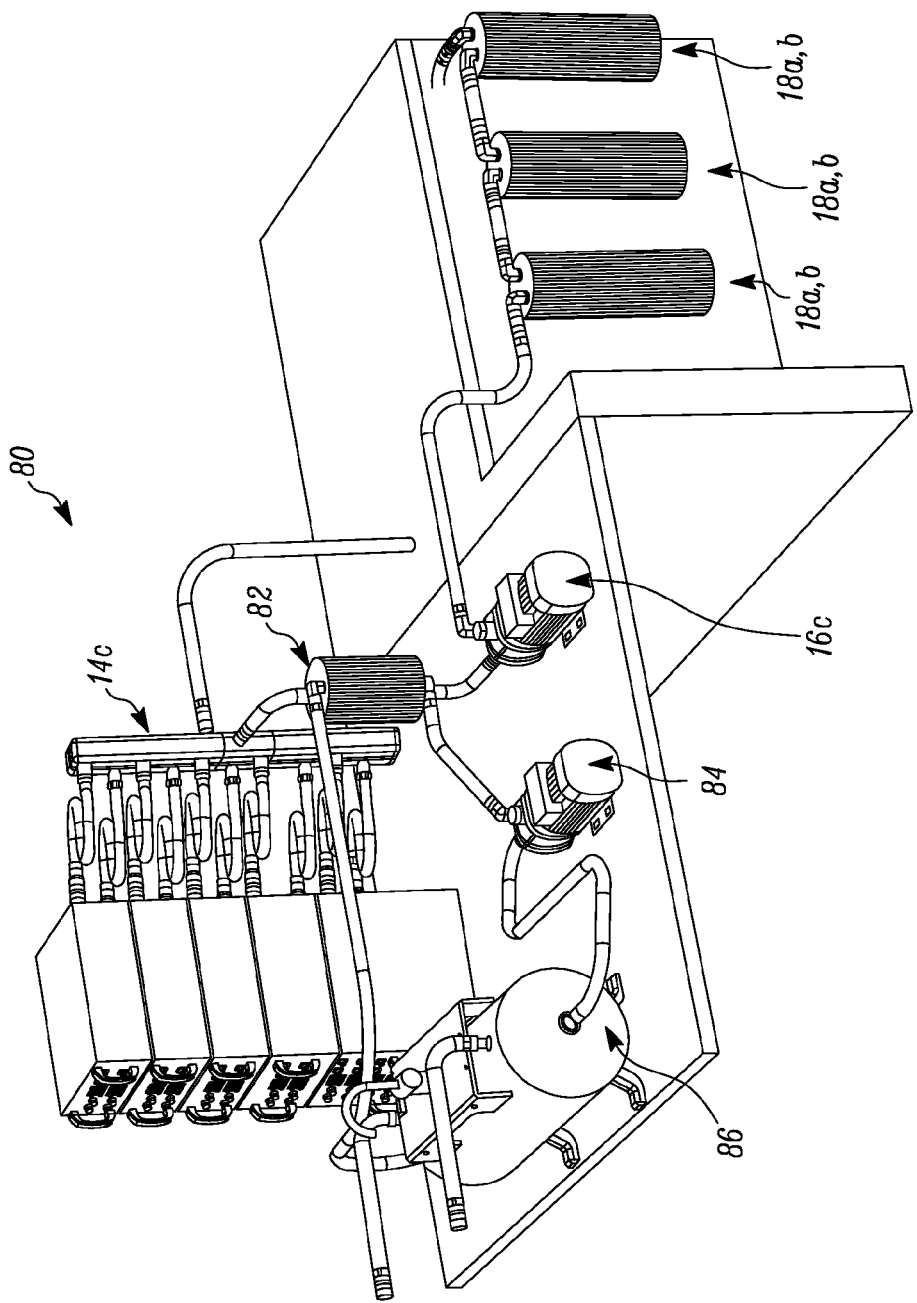
FIG. 9 illustrates still another exemplary application of an embodiment of the modular liquid submersion cooling system described herein.

FIG. 9 illustrates still another exemplary application of an embodiment of the modular liquid submersion cooling system described herein. The system 80 illustrated in FIG. 9 uses three of the heat exchanger units 18a, b that are buried in the ground as in FIG. 7 (or submerged in a body of water as in FIG. 8) to cool the cooling liquid as it flows through the heat exchanger units. In this example, the system 80 includes enclosures 12a-c, manifold 14c and pump 16c as in FIG. 8. However, in this embodiment, the manifold 14c is fluidly connected to a coolant-to-water heat exchanger 82. Heated cooling liquid is directed from the manifold 14c into the heat exchanger 82. In a separate loop, water is pumped by a pump 84 from a water tank 86 to the heat exchanger 82 to exchange heat with the cooling liquid and heat the water. The heated water can then be returned back into the tank 86 or directed elsewhere for use. After the heat exchanger 82, the cooling liquid is pumped into the heat exchangers 18a, b which further cools the liquid before the liquid is returned to the manifold 14c.

Figure 10:
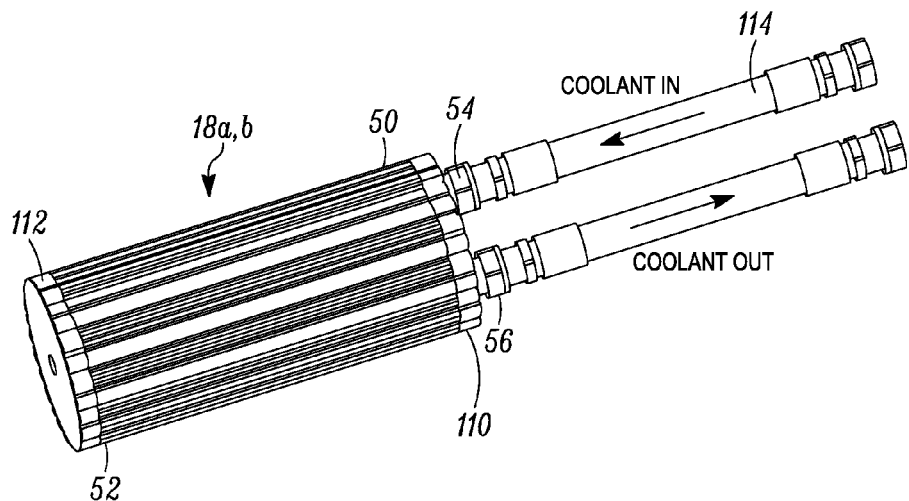
FIG. 10 illustrates details of the modular heat exchanger unit.
Figure 11:
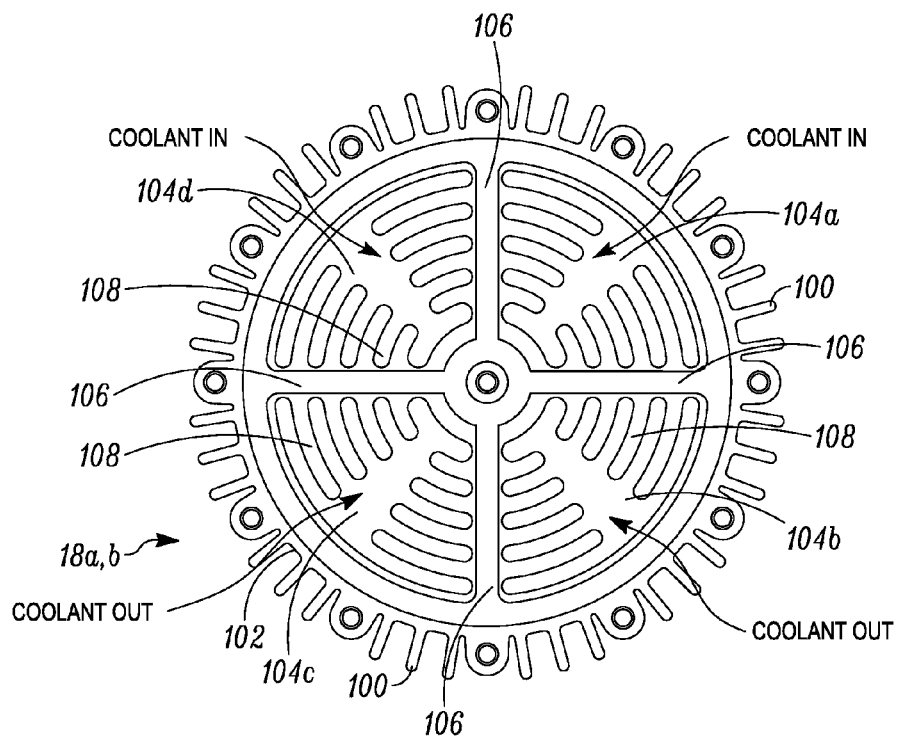
FIG. 11 is an end view of the heat exchanger unit of FIG. 10 with the endcaps removed.

FIGS. 10-11 illustrate further details of an exemplary construction of the heat exchanger units 18a, b. As discussed above, the heat exchanger units can include a first axial end 50 and a second axial end 52, a liquid inlet 54 and a liquid outlet 56. The plurality of elongated, radially extending heat exchange fins 100 are disposed on the outer surface 102 of each unit and extend axially and continuously generally from the first axial end 50 to the second axial end 52. The interior of the heat exchanger unit is divided into four separate fluid passageways 104a, b, c, d by internal walls 106. In addition, each internal wall 106 includes a plurality of arcuate or curved heat exchange fins 108 that extend into the fluid passageways and that increase in circumferential length as they extend away from the center. The fins 108 are radially spaced from one another to allow liquid to flow between the fins.

In the heat exchanger units 18a, b, one or more endcaps 110, 112 at the axial ends 50, 52 are used to close the ends of the heat exchanger units and dictate the flow path of fluid through the heat exchanger unit. For example, in FIGS. 10 and 11, the endcaps 110, 112 are configured such that the cooling liquid entering the inlet 54 from the conduit 114 to be cooled is directed by the endcap 110 to flow through the passageways 104a, 104d. The fluid then flows axially to the end of the heat exchanger unit, and is then directed by the endcap 112 to flow axially through the passageways 104b, 104c and then out through the outlet 56. In this example, the endcap 110 essentially closes the fluid passageways 104b, 104c to the incoming flow, while placing each of the passageways 104a, 104d in communication with the inlet 54. Likewise, the endcap 112 receives the flow in the passageways 104a, 104d and directs the flow into the passageways 104, 104c.

In FIGS. 10-11, the endcap 112 is configured the place the fluid passageways 104a, 104d in fluid communication with the fluid passageways 104b, 104c.

Figure 14A:
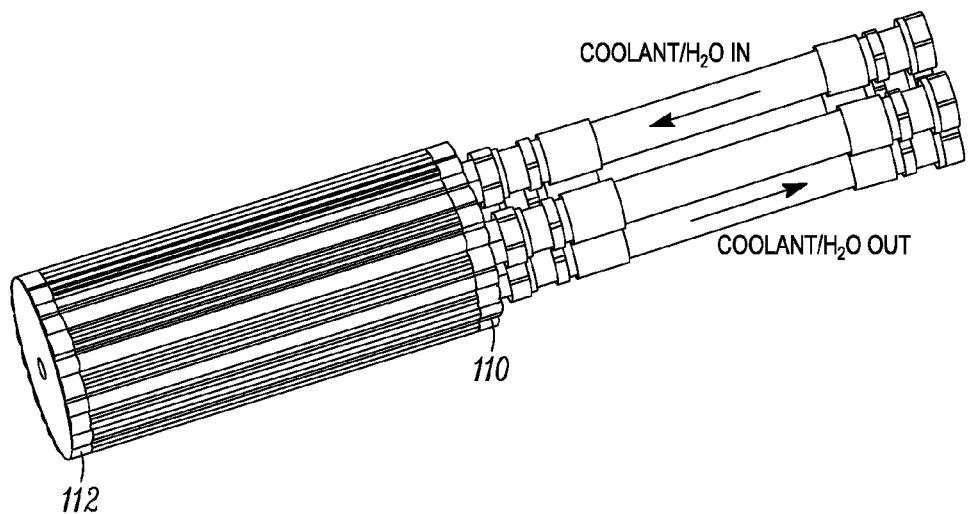
FIGS. 14A and 14B illustrate another possible embodiment of flow paths through the heat exchanger unit.
Figure 14B:
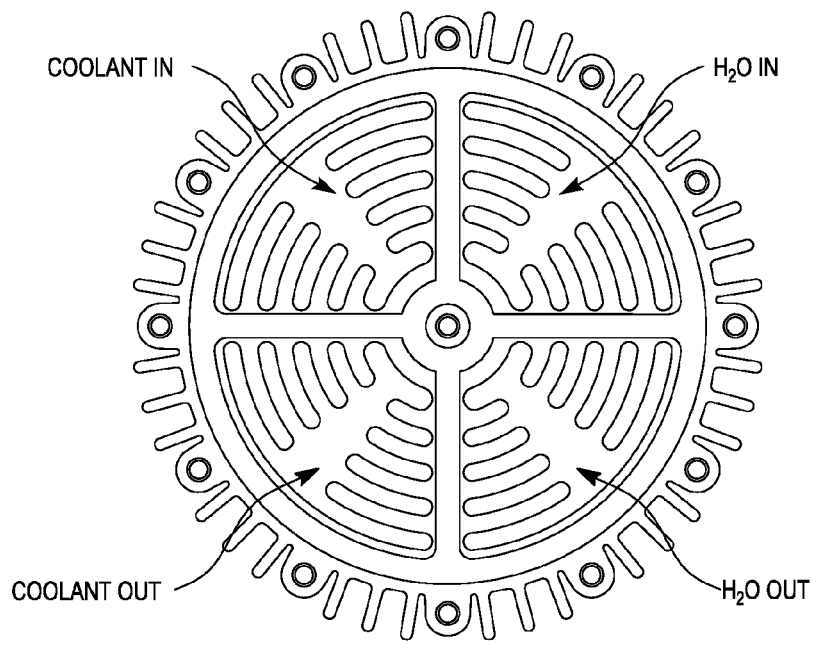
Figure 15A:
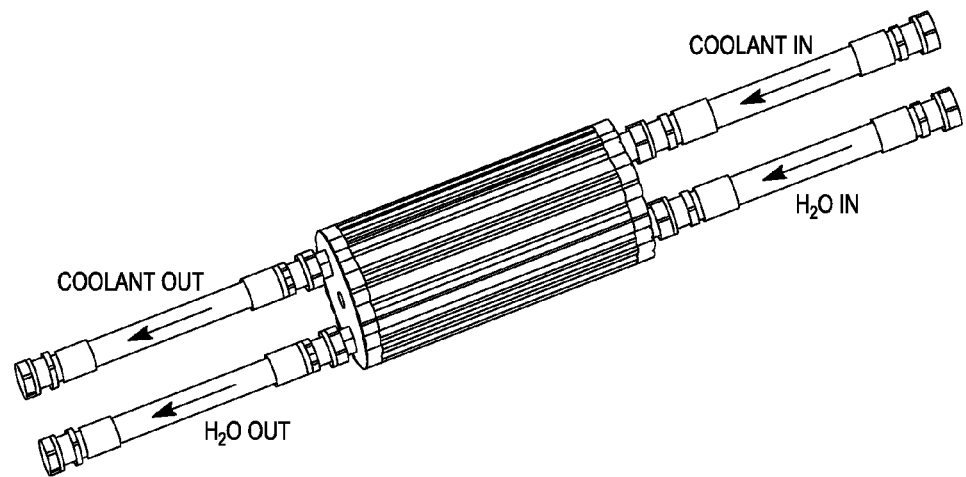
FIGS. 15A and 15B illustrate another possible embodiment of flow paths through the heat exchanger unit.
Figure 15B:
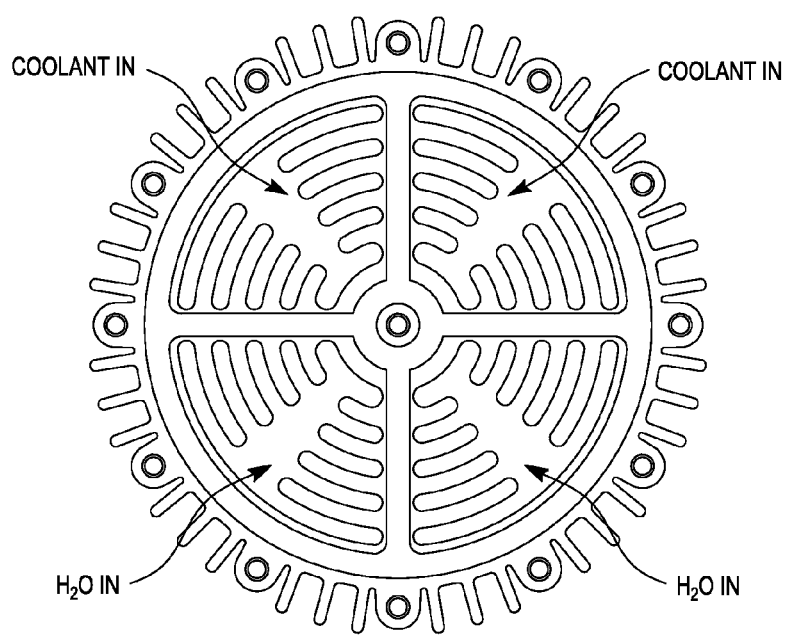
Figure 16A:
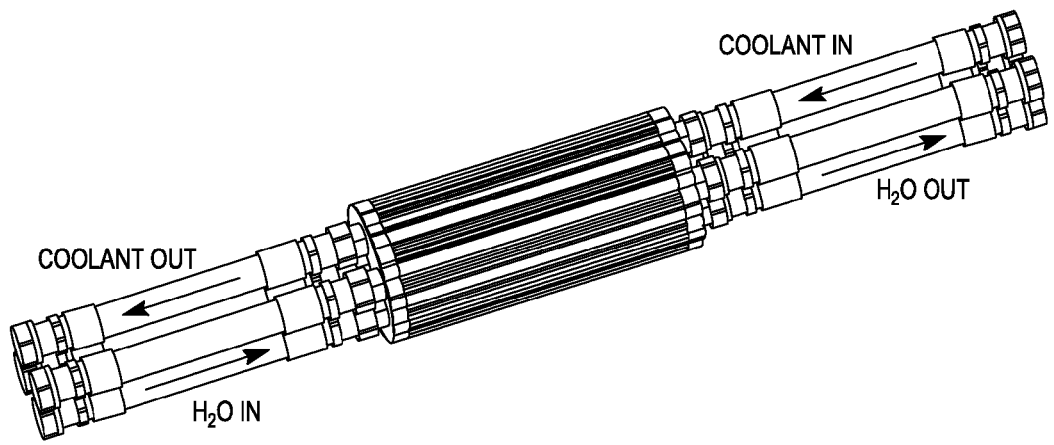
FIGS. 16A and 16B illustrate another possible embodiment of flow paths through the heat exchanger unit.
Figure 16B:
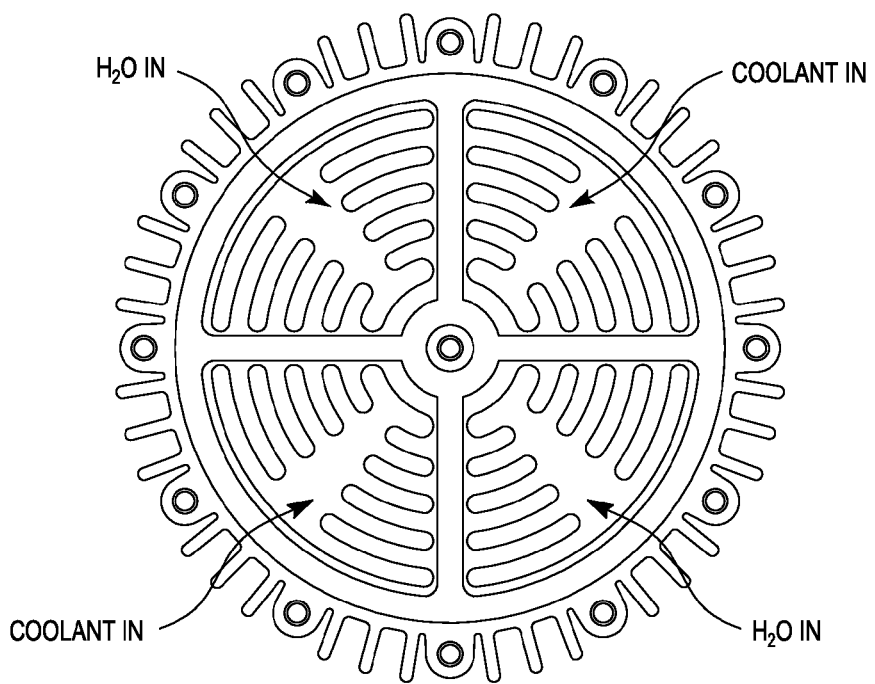
Figure 17A:
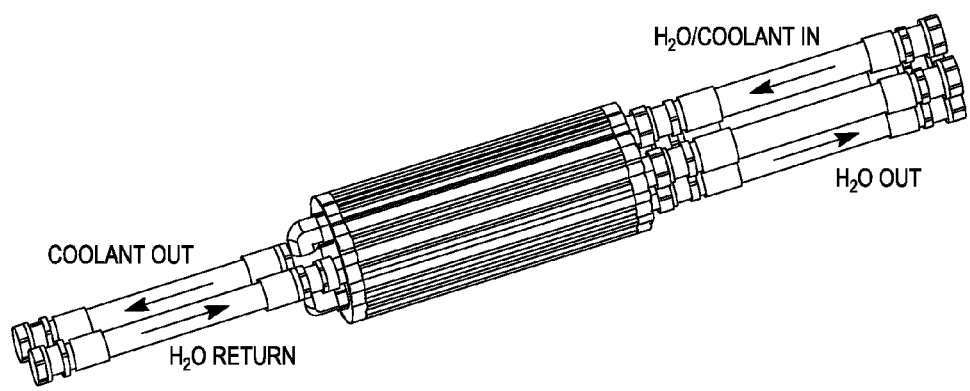
FIGS. 17A and 17B illustrate another possible embodiment of flow paths through the heat exchanger unit.
Figure 17B:
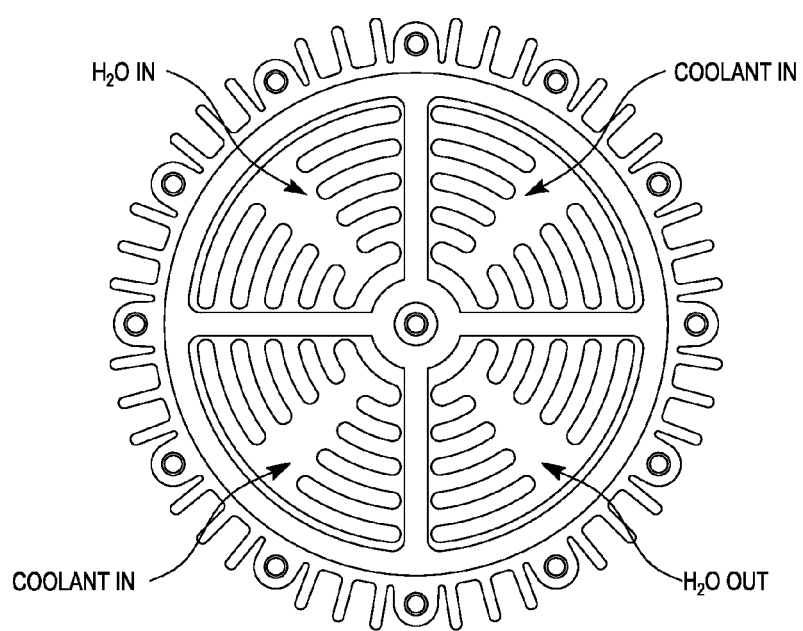
Figure 18A:
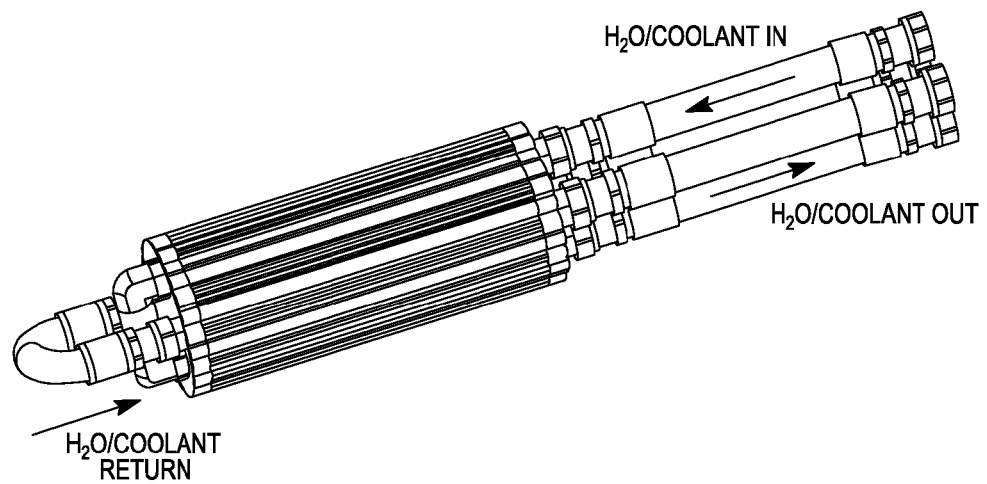
FIGS. 18A and 18B illustrate another possible embodiment of flow paths through the heat exchanger unit.
Figure 18B:
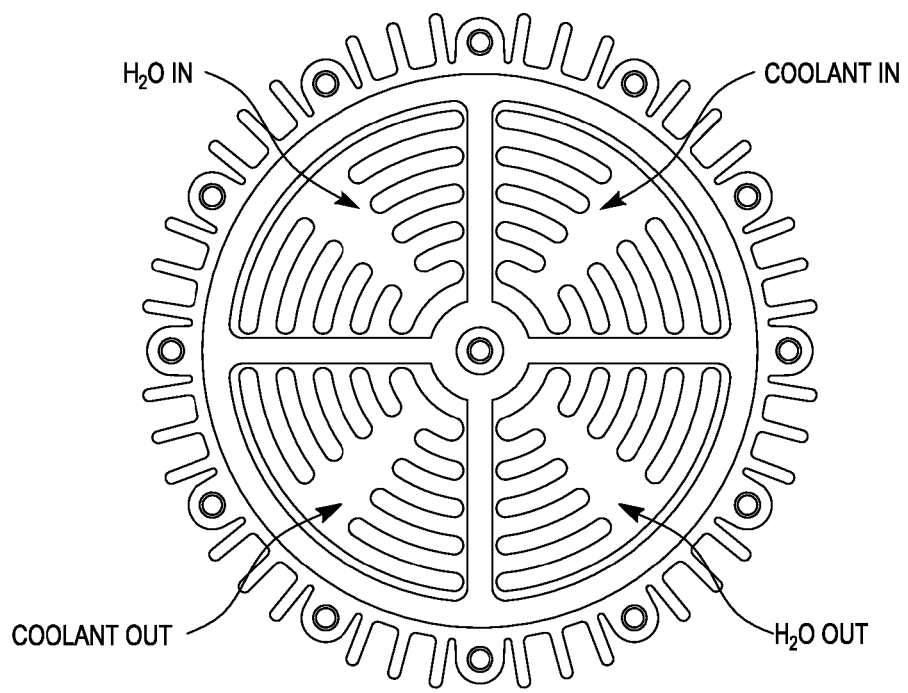
Figure 19A:
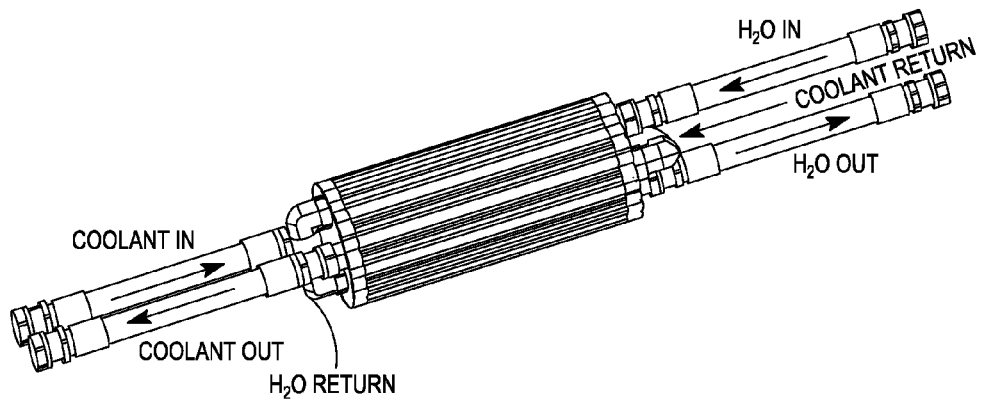
FIGS. 19A and 19B illustrate another possible embodiment of flow paths through the heat exchanger unit.
Figure 19B:
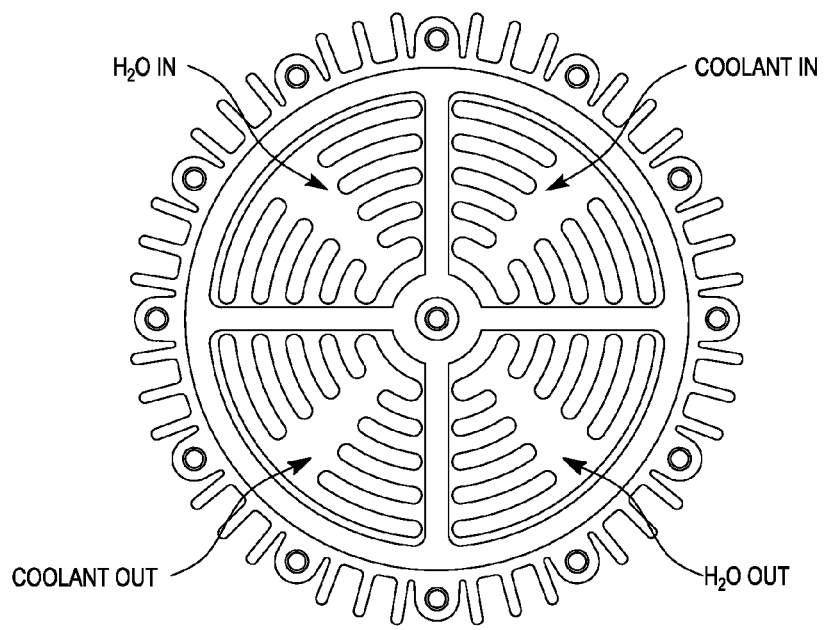

FIGS. 14A and 14B illustrate an example where the endcap 112 is configured to place the fluid passageway 104a in fluid communication with the fluid passageway 104b for one fluid, and to place the fluid passageway 104d in fluid communication with the fluid passageway 104c for a second fluid. The endcap 110 includes two inlets for different fluids and two outlets, with the fluid passageway 104a in communication with one inlet and the fluid passageway 104d in communication the second inlet, and the passageways 104b, 104c being closed to the incoming flow but being in communication with the outlets.

FIGS. 15-20 illustrate additional exemplary embodiments of flow configurations that can be achieved by changing the configurations of the endcaps.

The endcaps can also be used in a stacked arrangement to control the flow of multiple fluids through the fluid passageways of the heat exchanger unit.

Figure 12:
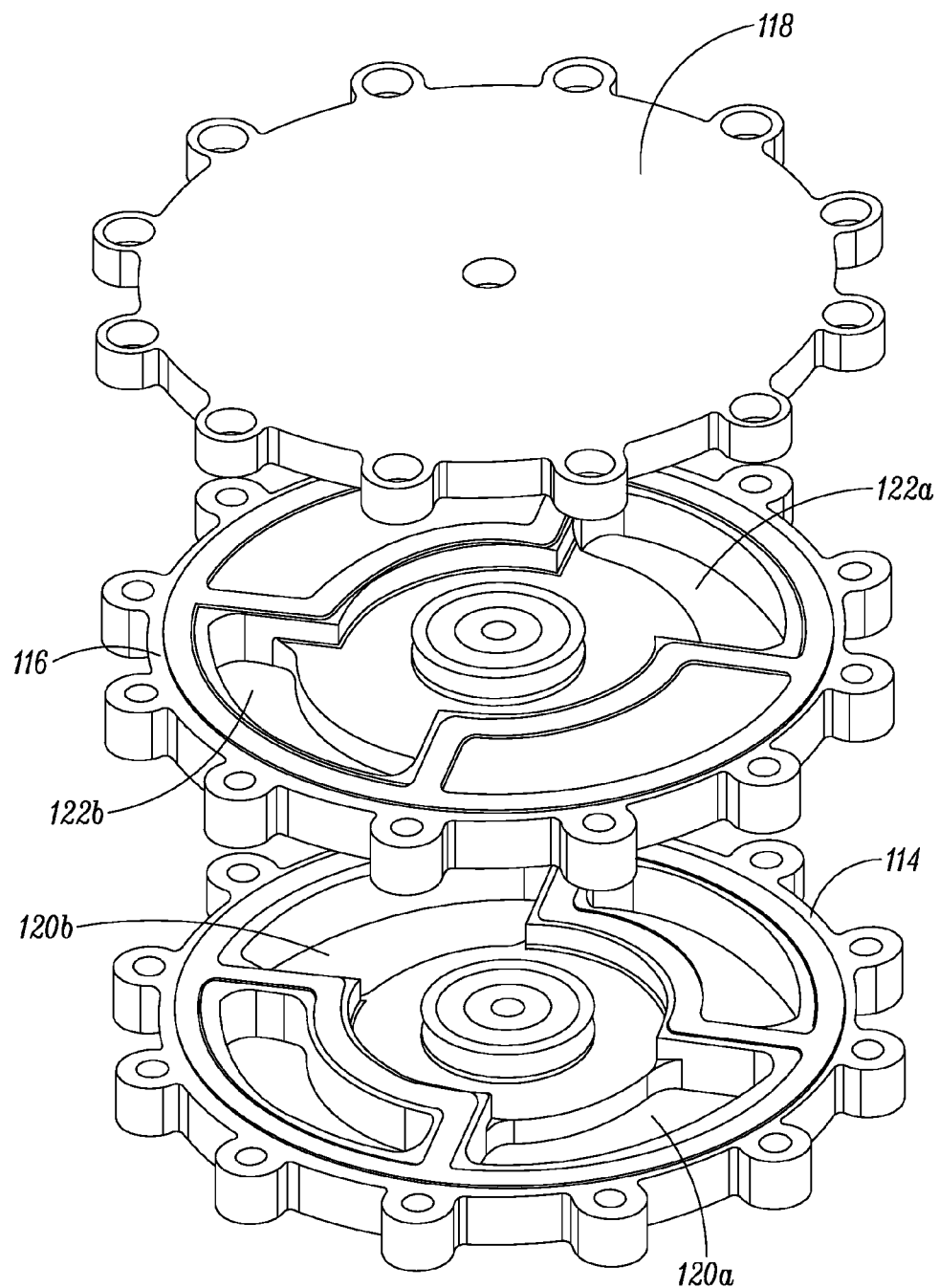
FIG. 12 illustrates examples of endcaps that can be used to dictate the flow path through the fluid passageways of the heat exchanger unit.
Figure 13:
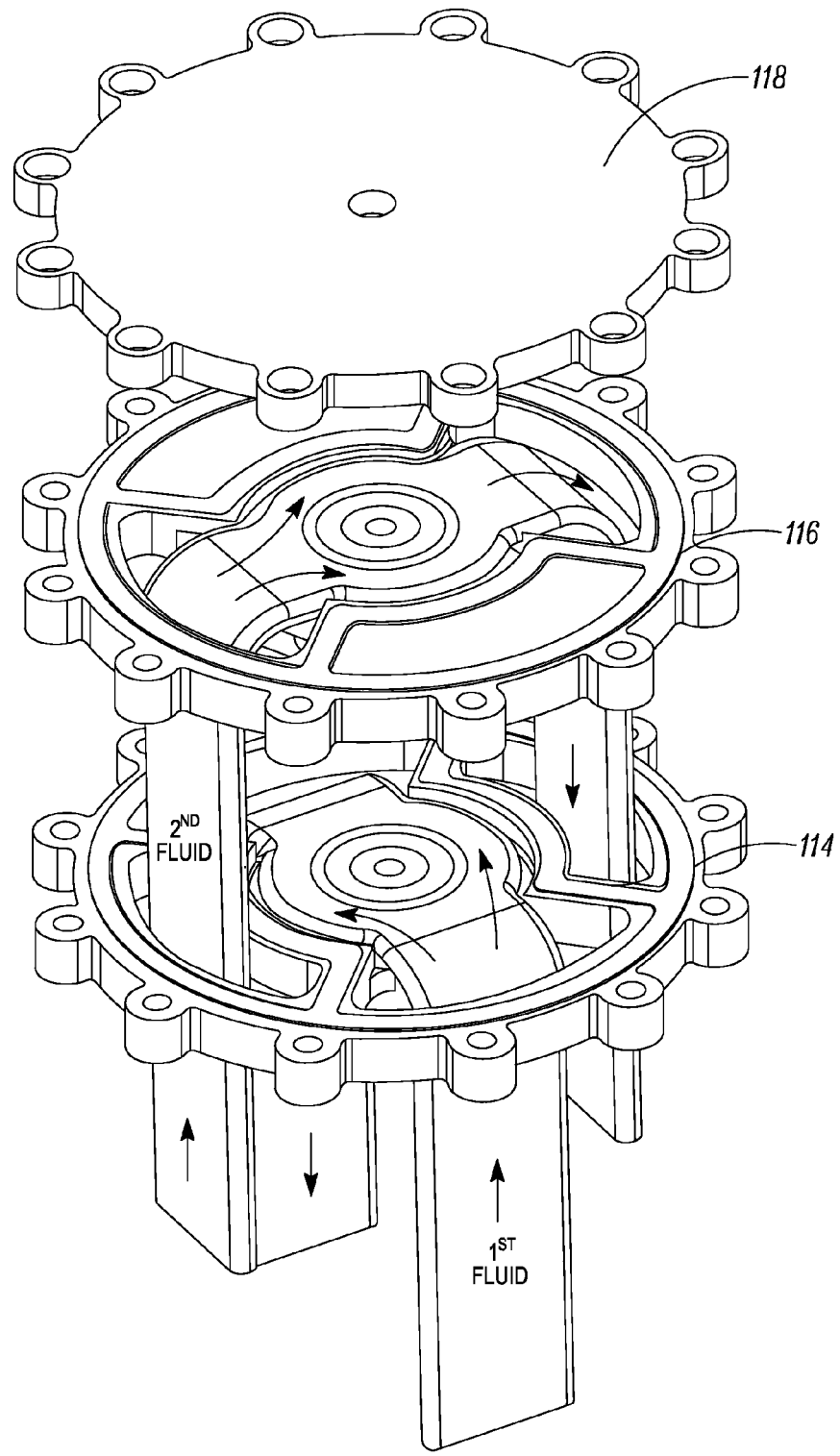
FIG. 13 illustrates two exemplary flow paths of the endcaps in FIG. 12.

FIG. 12 illustrates an example of stacked endcaps 114, 116 and a closing end cap 118. In this example, the endcap 114 includes passages 120a, 120b that fluidly connect diametrically opposite ones of the passageways 104a, 104c or 104b, 104d. On the other hand, the endcap 116 includes passages 122a, 122b that fluidly connect the other two diametrically opposite passageways 104a, 104c or 104b, 104d. So, for example, as illustrated in FIG. 13, one fluid can flow from one passageway of the heat exchanger unit and into the passage 120a, cross-over to the other passage 120b, and then flow in the opposite direction in the diametrically opposite fluid passageway of the heat exchanger unit. Likewise, one fluid can flow from one passageway of the heat exchanger unit and into the passage 122a, cross-over to the other passage 122b, and then flow in the opposite direction in the diametrically opposite fluid passageway of the heat exchanger unit. The endcap 118 closes the end of the heat exchanger unit.

Rotation of the endcaps 114, 116 can control which passageways of the heat exchanger unit are fluidly connected together. In addition, instead of fluidly connecting diametrically opposite ones of the passageways 104a-d, the endcaps 114, 116 can be configured to fluidly connect adjacent ones of the passageways 104a-d, for example passageways 104a,b and passageways 104c, d, with rotation of the endcaps then controlling which of the two adjacent fluid passageways are fluidly connected.

Figure 20A:
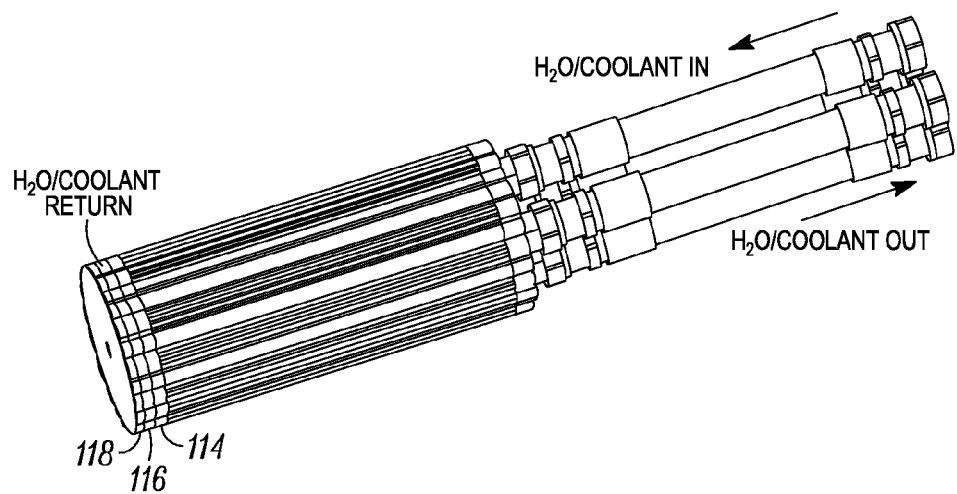
FIGS. 20A and 20B illustrate another possible embodiment of flow paths through the heat exchanger unit.
Figure 20B:
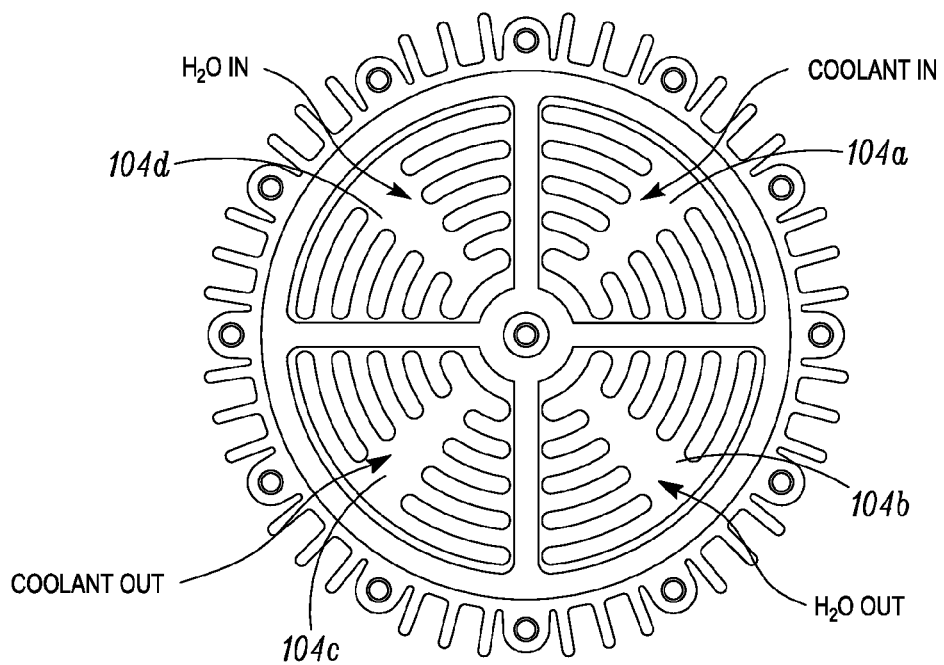

FIGS. 20A and 20B illustrate an example of the stacked arrangement of the endcaps 114, 116 having the configuration shown in FIGS. 12 and 13, and the closing endcap 118. In this example, the endcap 114 fluidly connects two of the passageways, such as the passageways 104a, 104c for the cooling liquid, and the endcap 116 fluidly connects the passageways 104b, 104d for a second fluid such as water that is used to exchange heat with the cooling liquid.

Thus by suitable design of the endcaps and/or using different stacked combinations of endcap designs, different flow path configurations can be implemented. The flow paths and endcap configurations illustrated in FIGS. 10-20 are exemplary only. Many different configurations of single and stacked endcap designs can be utilized to achieve alternative flow path configurations.

The concepts described may be embodied in other forms without departing from the spirit or novel characteristics thereof. The examples disclosed in this application are to be considered in all respects as illustrative and not limitative.

The invention claimed is:

1. A scalable liquid submersion cooling system for electronics, comprising: a plurality of modular electronics enclosures, each enclosure includes a liquid tight section that houses a plurality of electronic components to be liquid submersion cooled, a plurality of electronic components in the liquid-tight section, a liquid inlet to the liquid-tight section, and a liquid outlet from the liquid-tight section; a plurality of modular manifolds each of which is configured to fluidly connect to each electronics enclosure, each modular manifold includes a liquid supply manifold portion and a liquid return manifold portion, a plurality of liquid supply outlets in the liquid supply manifold portion, at least one liquid supply inlet in the liquid supply manifold portion, a plurality of liquid return inlets in the liquid return manifold portion, and at least one liquid return outlet in the liquid return manifold portion; and for each of the modular manifolds, the number of liquid supply outlets and the number of liquid return inlets differ between each modular manifold but are the same within each modular manifold; a plurality of modular pumps each of which is configured to fluidly connect to the modular manifolds, each pump having a different pumping performance; and a plurality of modular heat exchanger units each of which is configured to fluidly connect to the modular pumps.

2. The scalable liquid submersion cooling system for electronics of claim 1, wherein there are at least three of the modular electronics enclosures, at least two of the modular manifolds, at least three of the modular pumps, and at least two of the modular heat exchanger units; and
   the at least two modular heat exchanger units have different heat exchange capacities.

3. The scalable liquid submersion cooling system for electronics of claim 1, wherein the system comprises each of the following:
   a first manifold/pump combination wherein at least one of the modular manifolds and at least one of the modular pumps are configured for use together and the electronic components generate up to about 5 kW of energy during use;
   a second manifold/pump combination wherein at least one of the modular manifolds and at least one of the modular pumps are configured for use together and the electronic components generate between about 5 kW to about 15 kW of energy during use; and
   a third manifold/pump combination wherein at least one of the modular manifolds and at least one of the modular pumps are configured for use together and the electronic components generate between about 15 kW to about 30 kW of energy during use.

4. The scalable liquid submersion cooling system for electronics of claim 1, wherein:
   one of the modular heat exchanger units has a heat exchange capacity of up to about 5 kW; and
   one of the modular heat exchanger units has a heat exchange capacity of up to about 10 kW.

5. The scalable liquid submersion cooling system for electronics of claim 1, further comprising a dielectric cooling liquid in the liquid-tight section of each of the modular electronics enclosures.

6. The scalable liquid submersion cooling system for electronics of claim 5, wherein the dielectric cooling liquid is a single phase liquid.

7. The scalable liquid submersion cooling system for electronics of claim 1, wherein the electronic components are high-power density electronics.

8. The scalable liquid submersion cooling system for electronics of claim 7, wherein the high-power density electronics function as server computers, blade servers, disk arrays/storage systems, solid state memory devices, storage area networks, network attached storage, storage communication systems, routers, telecommunication infrastructure/switches, wired, optical and wireless communication devices, cell processor devices, printers, or power supplies.

9. The scalable liquid submersion cooling system for electronics of claim 1, wherein each of the modular heat exchanger units comprises:
   a cylindrical housing with an outer surface, an interior space, a first axial end, and a second axial end; and
   a plurality of radially extending external heat exchange fins on the outer surface extending from the first axial end to the second axial end.

10. The scalable liquid submersion cooling system for electronics of claim 9, wherein each of the modular heat exchanger units further comprises:
    a plurality of walls that divide the interior space into a plurality of fluid passageways;
    a plurality of internal heat exchange fins extending from the walls into the fluid passageways.

11. The scalable liquid submersion cooling system for electronics of claim 10, wherein the internal heat exchange fins are curved, radially spaced from each other, and increase in circumferential length as they extend away from a center of the interior space.

12. The scalable liquid submersion cooling system for electronics of claim 9, further comprising at least one first endcap at the first axial end; at least one second endcap at the second axial end; and at least one liquid inlet and at least one liquid outlet formed in the at least one first endcap, formed in the at least one second endcap, or formed in each of the at least one first endcap and the at least one second endcap.

13. The scalable liquid submersion cooling system for electronics of claim 10, further comprising first and second endcaps at the first axial end; the first end cap including passages that are in fluid communication with two of the fluid passageways; and the second end cap including passages in fluid communication with the two fluid passageways and the passages in the first end cap and passages in fluid communication with another two of the fluid passageways.

* * * * *